United States Patent [19]
Wilkie

[11] Patent Number: 5,238,709
[45] Date of Patent: Aug. 24, 1993

[54] ELECTROSTATIC SPRAY COATING METHOD

[75] Inventor: Robert R. Wilkie, Carlisle, Mass.

[73] Assignee: W. R. Grace & Co.-Conn., New York, N.Y.

[21] Appl. No.: 691,659

[22] Filed: Apr. 26, 1991

[51] Int. Cl.$^5$ .............................................. B05D 5/12
[52] U.S. Cl. ................................. 427/475; 427/478; 427/480; 427/96
[58] Field of Search ...................... 118/626, 628, 638; 427/31, 27, 33, 475, 478, 480

[56] References Cited

U.S. PATENT DOCUMENTS 2,446,953  8/1948  Rausburg ........................... 118/628
4,263,335  4/1981  Wagner et al. ...................... 427/29

FOREIGN PATENT DOCUMENTS 2923604 12/1976  Fed. Rep. of Germany ........ 427/27

*Primary Examiner*—Shrive Beck
*Assistant Examiner*—Benjamin L. Utech
*Attorney, Agent, or Firm*—Nicholas P. Triano, III; John J. Wasatonic; William L. Baker

[57] ABSTRACT

A method and apparatus are provided for electrostatically applying a coating, such as solder mask, to a substrate such as a circuit board. A grounded conveyor system includes electrically conductive means for suspending the substrate from the conveyor and grounding the substrate. An atomizing spray nozzle provides an atomized, electrically charged spray of the coating material in the direction of the grounded substrate. A focusing element is positioned to confine the spray to a desired pattern, and a receiving backplate, which carries a charge opposite that of the spray, is positioned behind the substrate to attract the charged coating particles that do not impinge on the substrate.

6 Claims, 2 Drawing Sheets

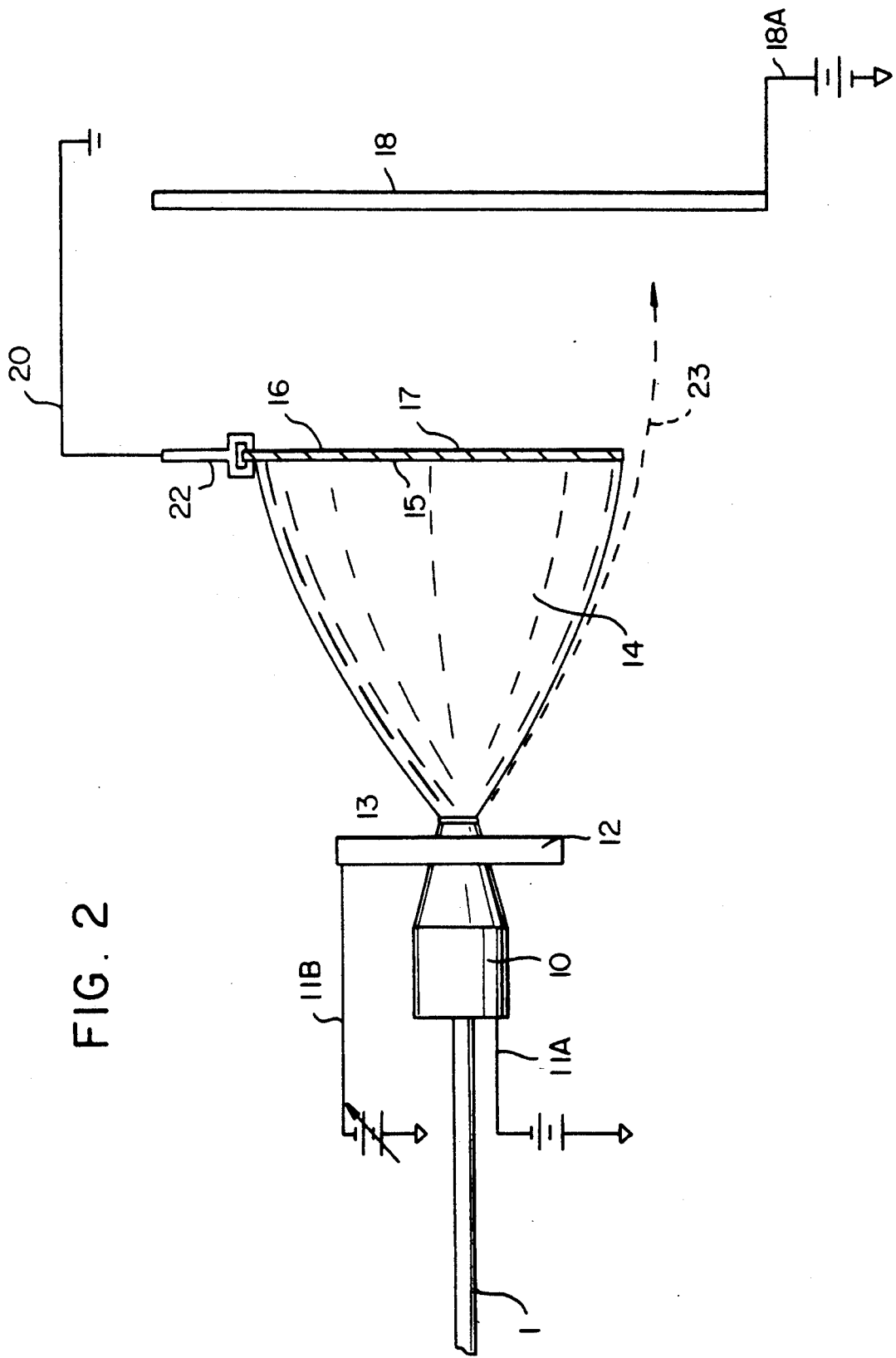

ELECTROSTATIC SPRAY COATING METHOD

BACKGROUND OF THE INVENTION

The field of this invention concerns electrostatic coating or spraying of substrates, and in particular, electrostatic coating or spraying of printed circuit boards with photopolymerizable solder mask.

Solder mask is a photocurable polymeric composition used to protect printed circuit boards during etching. Typically solder mask contains styrene maleic anhydride copolymers partially esterified with a hydroxy alkyl methacrylate, reactive monomers and certain multifunctional epoxies. Suitable solder mask compositions are disclosed in published European Patent Application 0 366 333, the disclosure of which is herein incorporated by reference.

Single, double, or multilayer printed circuit boards may be coated on one side or two sides with solder mask. After the board has been coated and dried, a photographic negative containing opaque images of areas where solder connections are to be made on the board is laid over the board surface. The board and negative are then exposed to ultraviolet light; the light that passes through the negative crosslinks the photopolymer in the solder mask. After exposure, the board is "developed" in a solvent system to wash away any photopolymer which was not crosslinked. The crosslinked photopolymer adhering to the board will protect the underlying material during subsequent treatment processes and when placed in actual operation. After washing and drying, the board is dipped into molten solder. Solder adheres to the board areas not covered by the mask composition. Electronic components may now be easily mounted to the board at the soldered connecting points.

U.S. Pat. No. 4,949,665, to Weber, the disclosure of which is herein incorporated by reference, discloses apparatus for coating both sides of printed circuit boards. The apparatus includes a conveyor having a moveable transport slide into which the circuit board to be coated is placed. The board thus travels through a coating device where it is coated on one side with a coating. The transport slide is then halted on the conveyor and turned around. The transport slide then travels back through the coating device so that the second side of the circuit board can be coated in the same manner in which the first side was coated. The board is then transported into a dryer where both sides of the board are dried uniformly.

One conventional means for applying the solder mask to circuit boards is by electrostatic spraying. Apparatus employing an electrostatic field is disclosed in U.S. Pat. No. 4,826,703 to Kisler, of which is herein incorporated by reference. An electrically conductive nozzle is used as the coating applicator, to which the coating material is pumped at a desirable flow rate. An electrostatic field is created so as to charge the coating particles. The web substrate is oppositely charged. The '703 patent also discloses controlling the width and improving the edge thickness uniformity of a layer of coating material that is electrostatically deposited on a moving web surface. This is accomplished by providing a pair of electrodes coupled to a source of electrical power and mounted in an opposed relation on opposite sides of the charged coating material moving between the coating applicator and the web surface spaced therefrom.

The use of electrodes to direct the coating particles to the substrate being coated is especially advantageous when using rotary atomizer nozzles to spray the coating. The nature of rotary atomizers is such that absent means to confine the spray pattern of the coating, the coating tends to be propelled in a wide pattern, thereby coating more than the circuit board. This results in considerable downtime, as the apparatus must be cleaned of the coating (solder mask). In addition, the coverage on the substrate tends to be non-uniform and in the shape of a raised donut; that is, the center portion of the substrate tends to have less coating than the outer circumference.

A further problem in electrostatically coating circuit boards occurs as one circuit board passes past the spray area. The next circuit board to be coated is spaced from the board previously coated, thereby creating a void into which the coating material is being sprayed while the second board is traveling towards the spray area. Since the boards attract the charged coating particles, as the first board passes by the spray area and the second board approaches the spray area, the coating particles do not pass straight through the gap between the boards, but rather tend to "wrap around" the boards and deposit on the side of the boards not facing the nozzle. This results in a non-uniform coating on the opposite sides of the boards and is highly undesirable.

SUMMARY OF THE INVENTION

The problems of the prior art have been solved by the instant invention, which provides an apparatus and a method for focusing the charged coating particles in a particular spray pattern in the direction of a substrate and for attracting the charged coating particles away from the remote side of the substrate being coated. Specifically, a method and apparatus are provided for electrostatically applying a coating, such as solder mask or primary resist, to a substrate such as a circuit board or metal foil. A grounded conveyor system includes electrically conductive means for suspending the substrate from the conveyor and grounding the substrate. An atomizing spray nozzle provides an atomized, electrically charged spray of the coating material in the direction of the grounded substrate. A focusing element is positioned to confine the spray to a desired pattern, and a receiving backplate, which carries a charge opposite that of the spray, is positioned behind the substrate to attract the charged coating particles that do not impinge on the substrate.

BRIEF DESCRIPTION OF THE DRAWINGS

FIG. 2 is a schematic diagram of the apparatus in accordance with the present invention.

DETAILED DESCRIPTION OF THE INVENTION

Figure 1:
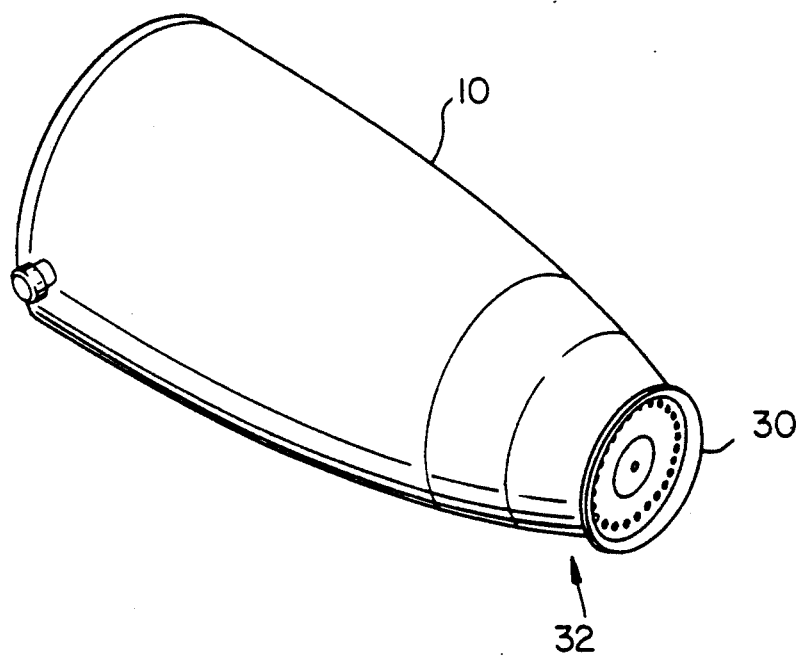
FIG. 1 is a perspective view of a nozzle which can be used in accordance with the present invention.

Turning now to FIG. 1, there is shown an "AEROBELL ™" rotary atomizer RMA-501 nozzle 10 available commercially from The DeVilbiss Company. The nozzle 10, which is a high speed bell type atomizer for electrostatic application of coating materials, is suitable for use in conjunction with the present invention. It includes an atomizer bell assembly 30 having an air annulus 32 at the bell edge for assistance in pattern control.

In FIG. 2, there is shown a nozzle 10 coupled to a high voltage source 11A for imparting a charge onto the coating particles. Focusing element 12 is shown in proximity to nozzle head 13, and is coupled to a variable voltage source 11B which imparts to element 12 a charge corresponding in polarity to that desired to impart to the coating particles. Focusing element 12 can be of any suitable shape, depending upon the desired characteristics of the spray pattern. A ring-like shape being approximately four inches in depth and in which the element 12 substantially encircles (but does not physically contact) nozzle 10 is preferred for uniformly coating a metal foil substrate with a primary resist. An open or "C" shaped focusing element is preferred for uniformly coating a circuit board substrate with solder mask. The "C" shaped element preferably forms an arc of about 270 degrees. The position of the opened portion of the "C" shaped element is not critical to the invention and may be varied to fit the desired spray characteristics. The focusing element 12 and the nozzle 10 may be separately or jointly movable towards and away from the substrate 16 to change the width of the spray pattern 14. For example, if the focusing element 12 is moved away from substrate 16, the spray pattern 14 is increased, or widened.

The coating material, such as a solder mask or primary resist, may be pumped to the nozzle 10 by any suitable means. Those skilled in the art will recognize that the pump flow rate and pressure in addition to the rotational speed of the bell, can be varied to vary the spray pattern 14. In the embodiment of coating a printed circuit board with solder mask, preferably the solder mask comprises styrene maleic anhydride copolymers partially esterified with a hydroxy alkyl methacrylate, reactive monomers and certain multifunctional epoxies, such as those disclosed in the aforementioned published European Patent Application 0 366 333.

A plurality of substrates 16, such as circuit boards or metal foils, are conveyed by conveying apparatus (not shown) along a selected path longitudinally spaced from the nozzle 10. For a substrate having dimensions of 18"×24", preferably the distance between the surface 15 being coated and the nozzle head 13 is about 4 inches to about 12 inches, most preferably about 8 inches. Those skilled in the art will recognize that this distance is not critical, and depends on the particular spray pattern desired as well as the other variables involved in forming the spray pattern. Holding means 22 grips the substrate 16 and is coupled by means of electrically conductive material such as wire 20 to ground, which may be the grounded conveyor apparatus. Since the coating particles are charged, the grounded substrate acts as a sink and attracts the particles to the surface 15.

As the substrate 16 is conveyed past the spray area, opposed surface 17 similarly attracts the charged coating particles. In order to minimize any coating being deposited on the opposed surface 16 at this time, a receiving backplate 18 is positioned in longitudinal spaced relation to the substrate 16 such that substrate 16 is conveyed between the nozzle 10 and the plate 18. The plate 18 is coupled to a voltage source 18A in order to provide the plate with a charge opposite that of the charge of the coating particles.

The backplate 18 may be any suitable conductive material capable of dissipating a charge and not deleteriously affecting the processing of the substrate 16. Suitable surfaces for the backplate include aluminum foil and stainless steel. Preferably the charged surface of the backplate 18 is comprised of stainless steel. A backplate comprised of stainless steel is advantageous because any spray coating impinging on it may be later "squeegeed" off easily and the collected solder mask may be re-used. The backplate 18 may be secured in position behind the substrate 16 by any suitable means. Preferably the backplate 18 is spaced from the surface 17 of substrate 16 by about 1 to about 4 inches, most preferably by 3 inches.

In a preferred embodiment, the particles and focusing element 12 are negatively charged, and the receiving backplate 18 is positively charged.

In operation, the grounded substrate 16 is conveyed toward the spray area. As it approaches the spray area, the charged spray particles are attracted to both the nozzle-facing surface 15 of the substrate 16 and the opposed surface 17 of the substrate. However, charged particles not impinging on surface 15 and passing by substrate 16 as shown by dotted line 23 in FIG. 2 are attracted by receiving backplate 18 having a charge opposite that of the particles, and therefore the particles do not deposit on the opposed surface 17 of the substrate 16. Similarly, as the substrate 16 passes past the spray area, the charged backplate 18 serves to attract the oppositely charged particles and again minimize any depositing of the coating material on the opposed surface 17 of the substrate.

The present invention provides a means and a process for electrostatically coating a substrate with a desired coating. Moreover, it overcomes the problem of coating being deposited on the opposite side of the substrate which such a partial coating is not desired.

While the present invention has been described in relation to its preferred embodiments, other embodiments can adhere the same result. Variations, modifications and equivalents of the present invention will be obvious to one skilled in the art and it is intended to cover in the appended claims all such variations, modifications and equivalents as fall within the true spirit and scope of this invention.

What is claimed is:

1. A method of electrostatically coating a plurality of grounded, spaced apart substrates comprising:
  a. spraying a charged coating material from a charged nozzle means directed to a spray area;
  b. confining said charged coating material to a desired spray pattern by means of a charged spray focusing means;
  c. conveying said substrates in a path longitudinally spaced from said nozzle means and wherein the longitudinal axis of symmetry of said spray pattern is normal to said path so that said substrates approach, enter and leave said spray area; and
  d. providing receiving backplate means for attracting said charged coating material, said backplate means being longitudinally spaced from said substrates so that said substrates are conveyed between said nozzle means and said backplate means, whereby, as said substrates approach and leave said spray area, charged coating material not impinging on said substrates impinges on said backplate means.

2. The method of claim 1 wherein said coating material is solder mask and said substrates are circuit boards.

3. The method of claim 1 wherein said coating material is primary resist and said backplate means comprises metal foil.

4. The method of claim 1 wherein said backplate means bears a charge opposite to that of said charge on said coating material.

5. The method of claim 1 wherein said coating material is negatively charged.

6. The method of claim 1 wherein said spray focusing means comprises an electrically charged element having a charge corresponding in polarity to that of said coating material, said electrically charged element being spaced from and substantially encircling said spray nozzle means.

* * * * *